(12) United States Patent
Takei

(10) Patent No.: US 6,354,902 B1
(45) Date of Patent: Mar. 12, 2002

(54) METHOD OF PRODUCING COLOR SELECTION ELECTRODE AND CATHODE RAY TUBE

(75) Inventor: Shinzo Takei, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/262,038

(22) Filed: Mar. 4, 1999

(30) Foreign Application Priority Data

Mar. 12, 1998 (JP) .......................................... 10-061468

(51) Int. Cl.⁷ .................................................. H01J 9/00
(52) U.S. Cl. ........................................................ 445/47
(58) Field of Search ............................................ 445/47

(56) References Cited

U.S. PATENT DOCUMENTS 4,726,878 A * 2/1988 Gross ........................ 156/639
5,326,663 A    7/1994 Tanaka et al.

FOREIGN PATENT DOCUMENTS

| EP | 0 173 966    | 3/1986 |
| EP | 0 641 009 A2 | 3/1995 |
| JP | 55139742     | 10/1980 |
| JP | 56059433     | 5/1981 |
| JP | 57060640  *  | 4/1982 |
| JP | 60017837     | 1/1985 |
| JP | 60-30038     | 2/1985 |

* cited by examiner

Primary Examiner—Kenneth J. Ramsey
(74) Attorney, Agent, or Firm—Rader, Fishman & Grauer PLLC; Ronald P. Kananen, Esq.

(57) ABSTRACT

A color selection electrode and a method of producing the same, for a high definition cathode ray tube with a finer pitch of mask apertures free from limitations due to the thickness of the iron-alloy plate of the mask. The method comprising, the steps of depositing a first resist on both a surface of an iron-alloy plate comprised of a low carbon steel plate, a surface facing an electron gun (small diameter side) and another surface facing a phosphor screen (large diameter side) and patterning the resist by photolithography; forming an electrodeposited metal layer on portions of the electron gun side of the iron-alloy plate where the first resist is not formed; depositing a second resist on the entire surface of the iron-alloy plate which is directed to the electron gun side to cover the first resist and the electrodeposited metal layer; using the first resist as a mask and etching the surface of the iron-alloy plate which is directed to the phosphor screen side; and removing the first resist and the second resist.

4 Claims, 4 Drawing Sheets

METHOD OF PRODUCING COLOR SELECTION ELECTRODE AND CATHODE RAY TUBE

BACKGROUND OF THE INVENTION

1. Field of the Invention

The present invention relates to a color selection electrode (color selection mask) having a finer pitch of apertures, a method of producing the same, and a cathode ray tube using the same.

2. Description of the Related Art

Picture tubes, called Braun tubes or CRTs (cathode ray tubes), are being widely used as television receivers or computer displays. FIG. 8 is a cross-sectional view of a cathode ray tube. A container or tube comprises a panel 11, a funnel 12 and a neck 13, and the inside of the container is under a vacuum. In the neck part, an electron gun 14 is positioned which generates an electron beam 15. On the inside surface of the panel 11, a phosphor screen 16 is formed. Inside the container, a color selection electrode 17 is placed before the phosphor screen 16. A color picture tube has a color selection mask and a three-color (red, green, and blue) phosphor screen corresponding to the individual apertures on the color selection mask. The different color phosphors selectively emit light for color selection by the angle of incidence of an electron beam emitted from the electron gun to the color selection mask.

The color selection masks in actual use may be roughly classified according to the shape of the perforations into shadow masks having circular perforations and aperture grilles having a slit-shaped (rectangular) openings, but are often also known generically as "shadow masks".

For general television use, aperture grilles with slits of a width of about 200 to 250 $\mu$m arranged at a pitch of about 0.5 to 1.0 mm are often used, for example, in the TRINITRON brand system of Sony Corporation.

In the case of a shadow mask, a dot-shaped circular perforations of a diameter of about 200 to 250 $\mu$m are arranged regularly at about a 0.6 mm pitch. The smaller the pitch of the perforations, the higher the resolution, so as a color selection mask for a high definition cathode ray tube, a shadow mask with a pitch reduced to about 0.2 mm is used.

The ordinary method of manufacturing a color selection mask will be explained below.

First, a resist is coated on an iron-alloy plate of about 100 to 300 $\mu$m thickness to form a resist film. Next, the resist is exposed and developed in accordance with the pattern of the color selection mask for resist patterning. The resist is then used as a mask for etching the iron-alloy plate to open the required apertures, then the resist is removed.

After the color selection mask is perforated by the etching, it is worked to shape it to a curved surface having a predetermined radius of curvature. Next, it is heated at 400 to 500° C. and oxidized by reactive gas to blacken the surface. The blackening is to prevent random reflection.

The color selection mask manufactured by the above method is placed about 10 mm before the phosphor screen on the electron gun side.

In the conventional method of manufacturing a color selection mask explained above, the mask is only perforated by the etching method. The general limit in fine working the case of the etching method is about the same as the thickness of the worked plate in the case of the pitch of perforations and about 15% of the designated dimension in the case of the working precision.

Accordingly, when manufacturing a mask for a high definition cathode ray tube by the conventional method of manufacturing a color selection mask, the limit of fining of the pitch of the mask perforations becomes about the same as the thickness of the iron-alloy plate, that is, about 0.2 mm.

When manufacturing a mask for a high definition cathode ray tube by the above conventional method, since the limit of fining of the pitch of the mask perforations becomes about the thickness of the iron-alloy plate of the mask, finer mask perforations are generally formed by the method of making thinner the thickness of iron-alloy plate being worked thinner.

If just making a thin film, the instead of the conventional method of perforating a iron-alloy plate of a predetermined thickness by etching, it would be possible to make fine perforations precisely by forming a metal layer on portions other than the mask perforations by electrofineforming.

Japanese Unexamined Patent Publication (Kokai) No. 60-30038 discloses a shadow mask of a 100 $\mu$m thickness of the iron-alloy plate and about a 0.2 mm pitch of perforations manufactured only by electrofineforming without perforation by etching.

However, the mask apertures of the color selection mask must be tapered in cross-section so as not to obstruct a passing electron beam. When forming a color selection mask only by electrofineforming, it is difficult to give the fine mask apertures a tapered cross-sectional shape in a mask for a high definition cathode ray tube with a pitch of apertures narrower than the shadow mask described in the above Japanese Unexamined Patent Publication (Kokai) No. 60-30038. As shown in FIG. 9, the narrower the taper width (shown by "A" in FIG. 9) of the mask apertures and the closer the side walls of the mask apertures to perpendicular, the easier the occurrence of scattered electrons (halation) due to the random reflection of the electron beam at the inside surfaces of the mask perforations.

On the other hand, in the one-side etching method of etching from the side of the color selection mask which becomes the phosphor screen side, openings having the predetermined precision are formed by etching with slight over etching. As a result, especially when making the iron-alloy plate thin, the taper width shown in FIG. 9 tends to become narrower.

Even if the taper width a becomes narrower, not that much of a disadvantage arises in a color selection mask having a pitch of apertures of 0.6 mm or more, but in a color selection mask having a pitch of apertures of 0.4 mm or less, if the taper width becomes narrow, the above-mentioned halation may occur.

When making the iron-alloy plate of the mask thin, as explained above, not only does it become difficult to finely taper the cross-sectional shape of the mask apertures, but the disadvantage also arises in the mechanical strength of the mask member. It is also necessary to make the iron-alloy plate of the mask maintain tension when welding the color selection mask to the picture tube frame.

According to the conventional method of manufacture, there is a certain limit to thinning the color selection mask in order to avoid uneven etching when making the mask apertures and improve the uniformity. It is difficult to make the thickness less than 80 $\mu$m.

SUMMARY OF THE INVENTION

An object of the present invention is to provide a color selection electrode (a color selection mask) with a finer pitch of apertures free from limitations due to the thickness of the metal substrate.

Another object of the present invention is to provide a method producing the above color selection electrode.

Still another object of the present invention is to provide a CRT using the color selection electrode.

According to the present invention, there is provided a method of producing a color selection electrode used for a cathode ray tube including an electron gun and a phosphor screen, the color selection electrode being positioned between the electron gun and the phosphor screen and having apertures through which an electron beam generated from the electron gun selectively passes to the phosphor screen, the method comprising the steps of: depositing a first resist on both surfaces of a metal substrate, a first plane of the substrate facing the electron gun and a second plane of the substrate directing to the phosphor screen, and patterning the same by photolithography; electrodepositing a metal on portions of the first plane of the substrate where the first resist is not formed to form an electrodeposited metal layer; depositing a second resist on the entire surface of the substrate which is directed to the first plane to cover the first resist and the electrodeposited metal layer; using the first resist as a mask and etching the second plane of the substrate; and removing the first resist and the second resist.

By using electrofineforming to form an electrodeposited metal layer, it is possible to form mask apertures of a tapered cross-sectional shape at a high precision (i.e., a precision of ±5% or better) at the electron gun side of the mask i.e., at the (small diameter side of the mask apertures). By this, it is possible to manufacture a mask for a superhigh definition cathode ray tube with about a 15 μm diameter of openings on the electron gun side (small diameter side) and about a 0.06 mm pitch of apertures and possible to improve the resolution of the picture tube.

Further, if using electrofineforming, since it is possible to form an electrodeposited metal layer of a high hardness Hv 450 to 550, it is possible to increase the mechanical strength of the mask member. Accordingly, it is possible to secure tension when welding the color selection mask to the picture tube frame with the thickness of the iron-alloy plate.

The thickness of the iron-alloy plate can be made thinner to the limit of the secondary shaping for preventing strain in the mask perforations in the secondary shaping for making the mask a curved surface and the like. According to the method of manufacture of the present invention, for example, it is possible to make the thickness of an aperture grille thinner to about 30 μm.

Further, working the method of manufacture of the present invention is not accompanied with massive investment in new facilities; it is sufficient to just change part of the conventional color selection mask manufacturing equipment. For example, in the case of a two-side etching manufacturing apparatus, it is sufficient to change the first etching chamber to an electrofineforming chamber.

The method of producing a color selection electrode used for a cathode ray tube of the present invention preferably is characterized in that in the step of forming the electrodeposited metal layer, a metal is not electrodeposited on the second plane of the substrate.

The method of producing a color selection mask used for a cathode ray tube of the present invention preferably is characterized in that in the step of forming the electrodeposited metal layer, the second plane of the substrate is insulated by adhesion of a laminate film.

As a result, it is possible to prevent the formation of the electrodeposited metal layer on the surface of the phosphor screen side in the step of forming an electrodeposited metal layer on the surface of the electron gun side. Consequently, it is possible to improve the etchability of the etching of the phosphor screen side performed in the following step.

The method of producing a color selection electrode used for a cathode ray tube of the present invention preferably is characterized in that in the step of forming the electrodeposited metal layer, a metal is simultaneously electrodeposited on the second plane of the substrate as well.

As a result, since it is possible to eliminate the film forming and peeling step compared with the case of forming an insulating laminate film on the phosphor screen side, it is possible to improve the productivity.

The method of producing a color selection electrode used for a cathode ray tube of the present invention preferably is characterized in that the substrate and the electrodeposited metal layer are different types of metals.

A shadow mask normally has a transmittance of an electron beam of 15 to 20%. The remaining 80 to 85% of the electron beam strikes the shadow mask and flows inside the shadow mask as an electric current, therefore generating Joule's heat and causing the temperature of the shadow mask to rise. Accordingly, the shadow mask thermally expands during use, the relative positional relationship among the shadow mask, apertures, and phosphors changes, and, in extreme cases, the color purity and color uniformity (i.e. the white uniformity) on the screen fall. This phenomenon is called the doming effect.

Conventionally, to prevent doming of a color selection mask, Invar (an alloy of iron and nickel) is used as a low expansion material, a bimetal is used for the mask holding portion to correct the thermal expansion, or the mask surface is coated with various materials to raise the rigidity of the mask.

In the method of producing of the present invention, a metal layer having the above function is formed as an electrodeposited metal layer on the small diameter side of the mask apertures. Accordingly, the doming phenomenon is prevented and it is possible to make the mask thinner compared with the case of further coating a functional film on a mask formed with mask perforations with tapered cross-sections.

According to the method of producing of the present invention, by suitably selecting the types of the metals combined, it is possible to reduce not only the doming effect caused by thermal expansion, but also the AG vibration due to the intrinsic vibration, drift of the electron beam due to the magnetic characteristics, and halation due to the secondary electrons.

As examples of metals combined, mention may be made of an Fe layer and Fe-(35 to 45%)Ni layer, Cr layer or Cr alloy and Fe(35 to 45%)Ni layer, and so forth.

According to the present invention, there is also provided a color selection electrode used for a cathode ray tube including an electron gun and a phosphor screen, the color selection electrode being position between the electron gun and the phosphor screen and having apertures through which an electron beam generated from the electron gun selectively passes to the phosphor screen, the color selection electrode comprising: a metal substrate; an electrodeposited metal layer formed on a first plane of the substrate, directing to or facing the electron gun; a plurality of first apertures formed on the electrodeposited metal layer; and a plurality of second apertures formed on a second plane of the substrate, directing to or facing the phosphor screen, the second apertures having sectional areas larger than the first apertures and being connected to the corresponding first apertures.

The color selection electrode used for a cathode ray tube of the present invention preferably is characterized in that the sectional areas of the first apertures is constant, the sectional areas of the second apertures on the second plane is larger than the areas of the same on the first plane, and the second apertures are tapered in cross-section.

The color selection electrode used for a cathode ray tube of the present invention preferably is characterized in that the substrate comprises an iron-nickel alloy or a chromium alloy.

The color selection electrode used for a cathode ray tube of the present invention preferably is characterized in that the electrodeposited metal layer comprises ferrite, nickel, chromium or gold.

The color selection electrode used for a cathode ray tube of the present invention preferably is characterized in that the diameter of the first apertures are within 15 μm, and the apertures are arranged at a pitch of within 0.06 mm.

According to the present invention, there is further provided a cathode ray tube comprising an electron gun, a phosphor screen, and a color selection electrode placed between the electron gun and phosphor screen, and having apertures through which an electron beam generated from the electron gun selectively passes to the phosphor screen, wherein, in the color selection electrode, the cathode ray tube comprising: a metal substrate; an electrodeposited metal layer formed on a first plane of the substrate, directing to or facing the electron gun; a plurality of first apertures formed on the electrodeposited metal layer; and a plurality of second apertures formed on a second plane of the substrate, directing to or facing the phosphor screen, the second apertures having sectional areas larger than the first apertures and being connected to the corresponding first apertures.

BRIEF DESCRIPTION OF THE DRAWINGS

There and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
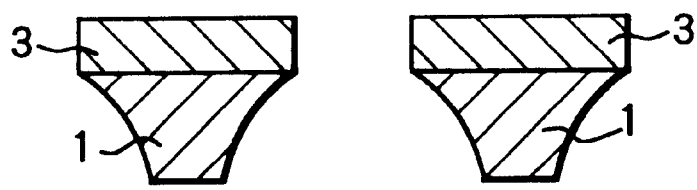
FIG. 1 is a cross-sectional view of a color selection mask, used for a high definition cathode ray tube, manufactured by the method of producing a color selection mask used for a high definition cathode ray tube of the present invention.

FIG. 1 is a cross-sectional view of a color selection electrode (i.e., a color selection mask) used for a high definition cathode ray tube manufactured by the method of manufacture of the present embodiment. An iron-alloy plate 1 is worked to a taper, and an electrodeposited metal layer 3 is formed on the electron gun side of the iron-alloy plate 1.

Next, an explanation will be made of a method of producing a color selection mask used for a high definition cathode ray tube of the above embodiment. FIG. 1 to FIG. 5 are sectional views showing manufacturing steps according to the method of producing a color selection mask used for a high definition cathode ray tube of the present invention.

First, the low carbon steel plate (i.e., an iron-alloy plate) 1 is washed by an alkaline degreasing agent. The material of the iron-alloy plate 1 is required to have etchability, press-formability for working it to a curved surface after the mask perforation, and a blackening property for blackening.

In particular, when uneven deformation due to yield elongation occurs at the time of press-forming, the pitch of perforations becomes off and a decline in the color purity is caused. As one factor of the yield elongation, mention may be made of the dissolved carbon remaining in the steel plate. Therefore, as the iron-alloy plate 1, for example, use is made of a material reduced in residual carbon by decarburization at the molten steel stage or strong decarburizing annealing at the steel plate stage (see Japanese Examined Patent Publication (Kokoku) No. 60-30727 and Japanese Examined Patent Publication (Kokoku) No. 63-40848).

As the material of the iron-alloy plate 1, for example, use may be made of low carbon aluminum killed steel foil, Invar steel plate having a low thermal expansion coefficient, shadow mask plate comprised of cold-rolled steel plate, for example, steel of a carbon content of 0.001 to 0.0035 wt % which is hot-rolled and acid cleaned, then cold roller and continuously annealed (describing Japanese Unexamined Patent Publication (Kokai) No. 9-53122), and so forth.

Further, it is possible to use a shadow mask material obtained by reducing the dissolved nitrogen, another factor of yield elongation, and as a result making the yield elongation not more than 0.6% to suppress the occurrence of nonuniform deformation (described in Japanese Unexamined Patent Publication (Kokai) No. 9-256062).

The two opposed surfaces of the iron-alloy plate 1 are coated with a first resist 2. As the resin of the first resist 2, for example, use may be made of a photosensitive resin comprised of casein and 1 wt % of ammonium dichromate with respect of the casein.

The first resist 2 is coated, for example, by the dip coating method of dipping the iron-alloy plate 1 in the photosensitive resin, then using a heater to dry the resist at about 80 to 100° C. Due to this, a first resist 2 of a thickness of 7 to 10 μm is formed on the surface of the iron-alloy plate 1. The first resist 2 can alternatively also be formed by a roll coater or various other types of coating devices.

Figure 2:
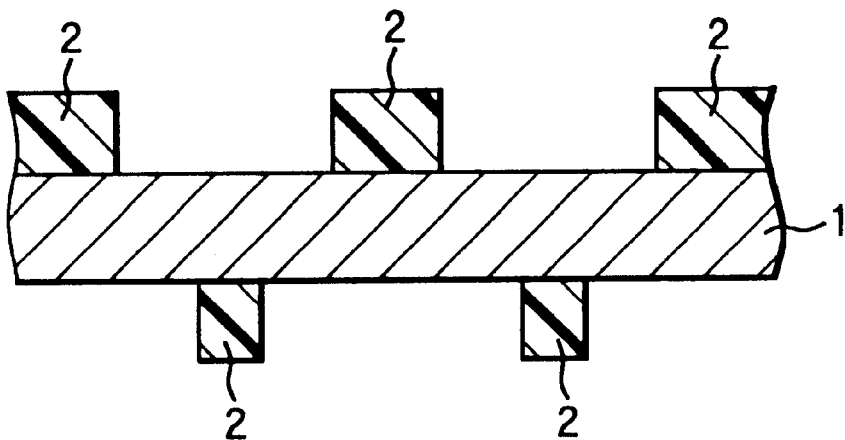
FIG. 2 is a cross-sectional view of a manufacturing step of the method of producing a color selection mask used for a high definition cathode ray tube of the present invention.

Next, using a separately prepared glass plate as a mask, this resist is exposed and fixed using a metal halide lamp or other source of UV rays, then is developed with water, whereby, as shown in FIG. 2, a predetermined pattern of the first resist 2 is formed on the two surfaces of the iron-alloy plate 1.

Next, the first resist 2 is immersed in 5 to 10% chromic acid to harden the resist film, then is washed with water. After this, it is burnished at about 200 to 250° C. (heat treated) to improve the etching resistance of the first resist 2.

Figure 3:
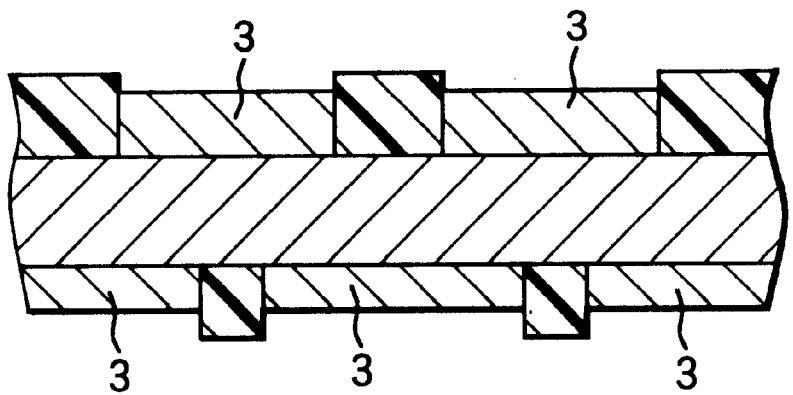
FIG. 3 is a cross-sectional view of a manufacturing step of the method of producing a color selection mask used for a high definition cathode ray tube of the present invention.

Next, the iron-alloy plate 1 formed with the first resist 2 is passed through an electrofineforming chamber to make the exposed portions of the iron-alloy plate 1 be electrodeposited with metal to a thickness of 5 to 10 μm. Excessively thick formation of the electrodeposited metal layer 3 is avoided. Due to this, as shown in FIG. 3, an electrodeposited metal layer 3 is formed on the two opposed surfaces of the iron-alloy plate 1.

By forming the electrodeposited metal layer 3 by electrofineforming, a controlled sectional shape is obtained. Further, while the processing precision is about 15% of the designated dimensions in the case of the etching method, it is a high precision of ±5% of the designated dimensions in the case of electrofineforming. Electrofineforming is suited to the fine working at the small diameter side of the mask apertures.

As the metal to be the electrodeposited metal, of the metal layer 3 mention may be made for example of ferrite, nickel, chromium, gold, and so forth. It may be suitably selected in accordance with the properties of the metals.

Further, for the purpose of improving the adhesion of the electrodeposited metal layer 3, instead of forming the electrodeposited metal layer 3 directly on the iron-alloy plate 1, it is also possible to from the electrodeposited metal layer 3 on a top layer comprised of iron, nickel, aluminum, or another conductive metal formed on the iron=alloy plate 1. If the electrodeposited metal layer 3 is formed very thinly (about 5 μm), however, no remarkable effect can be seen.

Figure 4:
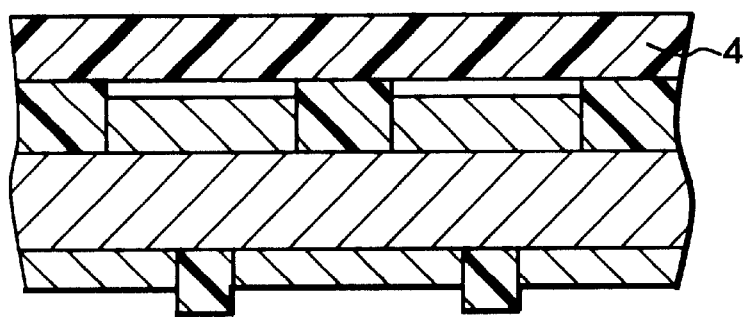
FIG. 4 is a cross-sectional view of a manufacturing step of the method of producing a color selection mask used for a high definition cathode ray tube of the present invention.

After the end of the electrodeposition, as shown in FIG. 4, a second resist (back coat) 4 is deposited on the entire surface of the iron-alloy plate 1 which will become the electron gun side. The second resist 4 is provided for preventing the etchant from invading other areas and the pattern already formed on the surface of the electron gun side being corroded when etching the phosphor screen side of the iron-alloy plate 1 in the following step.

As the material of the second resist 4, use may be made of the same ones as the first resist layer 2 and also use may be made of wax, a UV curing resin, and so forth.

Figure 5:
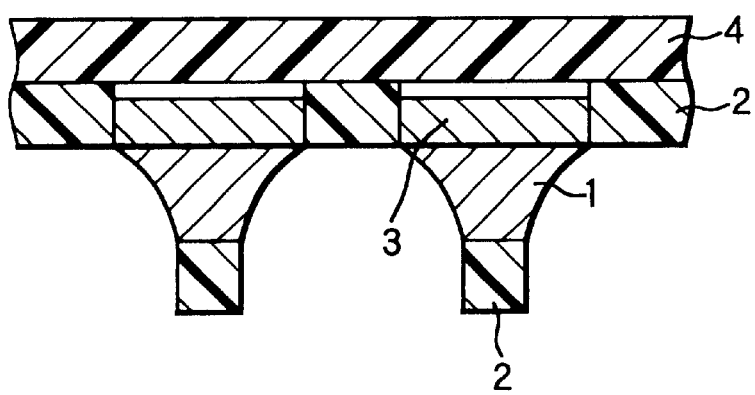
FIG. 5 is a cross-sectional view of a manufacturing step of the method of producing a color selection mask used for a high definition cathode ray tube of the present invention.

Using the first resist 2 as a mask, as shown in FIG. 5, the electrodeposited metal layer 3 on the phosphor screen side and iron-alloy plate 1 are etched. The etching is performed until even the thickness of the iron-alloy plate 1 is etched.

As the etchant, for example, use is made of ferric chloride of a Baumé degree of 45 to 48° Be. The etching surface of the iron-alloy plate 1 conveyed by a conveying roller is sprayed with an etchant from a spray unit to etch a ferrous metal sheet, that is, the iron-alloy plate 1. The spray pressure of the etchant is made 1.5 to 2.5 kg/cm$^2$-G.

Next, the first resist 2 and the second resist 4 are removed by for example using 10 to 20% sodium hydroxide containing a surfactant and heating to 80 to 90° C., whereby a color selection mask used for a high definition cathode ray tube shown in cross-sectional view in FIG. 1 is obtained.

Second Embodiment

FIG. 1 is a cross-sectional view of a color selection mask used for a high definition cathode ray tube produced by the method of producing of the present embodiment. In the same way as the first embodiment, the iron-alloy plate 1 is worked to a taper and an electrodeposited metal layer 3 is formed on the electron gun side of the iron-alloy plate 1.

Next, an explanation will be given of the method of producing of a color selection mask used for a high definition cathode ray tube of the above embodiment. FIG. 1, FIG. 2, and FIG. 5 to FIG. 7 are cross-sectional views of manufacturing steps according to the method of producing of a color selection mask used for a high definition cathode ray tube of the present embodiment.

First, a low carbon steel plate (iron-alloy plate) 1 forming the material is cleaned by an alkaline degreasing agent and then, in the same way as in the first embodiment, a first resist 2 is coated on the two surfaces. Next, this is exposed and developed using a glass plate, whereby, as shown in FIG. 2, a predetermined pattern of a resist 2 is formed on the two surfaces of the iron-alloy plate 1.

Further, as the second resist 2, instead of a liquid resist comprised of the casein and dichromate shown in the first embodiment, it is also possible to use a dry film formed by a base polymer, photopolymerizable polymer, and photosensitive coating containing a photopolymerization initiator disclosed in Japanese Unexamined Patent Publication (Kokai) No. 8-184962. In the case of using the above dried film as an etching resist, unlike the case of a liquid resist comprised of casein and dichromate, can be also used for forming a resist layer, the toxic hexavalent chrome is not discharged in the wastewater at the time of removing the resist, so that problem of wastewater treatment is eliminated.

Further, when using a dry film as the resist, since it is sufficient to laminate a dry film of a thickness of 15 to 50 μm on the iron-alloy plate 1, the coating, drying, and heating curing steps like in the case of a liquid resist become unnecessary. That is, the steps of manufacture of the color selection mask can be simplified.

Figure 6:
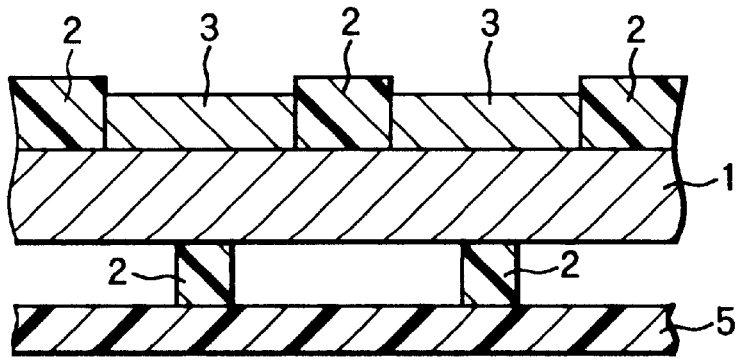
FIG. 6 is a cross-sectional view of a manufacturing step of the method of producing a color selection mask used for a high definition cathode ray tube of the present invention.

Next, as seen in FIG. 6, the phosphor screen side is covered and insulated by a laminate film 5. In this state, the iron-alloy plate 1 formed with the resist 2 is passed through an electrofineforming chamber and the exposed portion of the electron gun side of the iron-alloy plate 1 is electrodeposited with metal at a thickness of 5 to 10 μm. Due to this, as shown in FIG. 6, an electrodeposited metal layer 3 is formed on the electron gun side of the iron-alloy plate 1.

In the same way as in the first embodiment, with electrofineforming, fine working of the small diameter side of the mask perforations is possible and it is possible to obtain a controlled sectional shape with a high precision (±5%).

As the metal to be electrodeposited, mention may be made, for example, of ferrite, nickel, chromium, gold, or the like and may be suitably selected in accordance with the properties of the metals.

Figure 7:
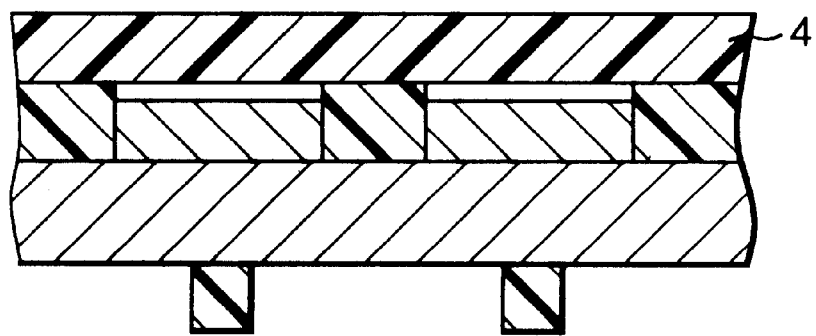
FIG. 7 is a cross-sectional view of a manufacturing step of the method of producing a color selection mask used for a high definition cathode ray tube of the present invention.
Figure 8:
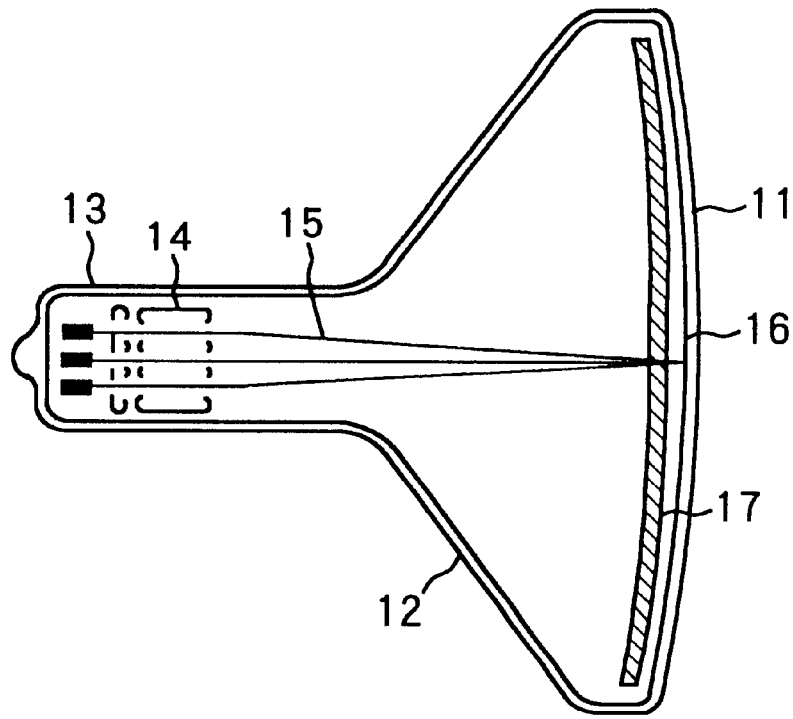
FIG. 8 is a cross-sectional view of a cathode ray tube.
Figure 9:
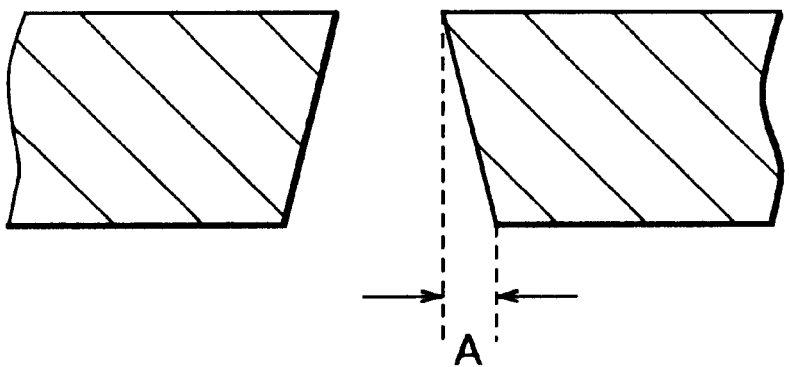
FIG. 9 is a cross-sectional view of a color selection mask, used for a high definition cathode ray tube, manufactured by a conventional method of producing a color selection mask used for a high definition cathode ray tube of the present invention.

After the end of the electrodeposition, as shown in FIG. 7, a second resist (back coat) 4 is deposited on the entire surface of the iron-alloy plate 1 which will become the electron gun side to cover the first resist 2 and the electrodeposited metal layer 3.

The laminate film 5 is peeled off, then the first resist 2 is used as a mask, as shown in FIG. 5, to etch the iron-alloy plate 1 from the phosphor screen side. The etching is performed until the thickness of the iron-alloy plate 1 is etched.

Next, the first resist layer 2 and the second resist layer 4 are removed in the same way as the first embodiment, whereby a color selection mask used for a high definition cathode ray tube shown in cross-sectional view in FIG. 1 is obtained.

According to the method of producing a color selection mask used for a high definition cathode ray tube of the embodiment of the present invention described above, it is possible to manufacture a color selection mask used for a high definition cathode ray tube with a pitch of apertures made finer to about 0.06 mm and thereby possible to improve the resolution of the high definition cathode ray tube.

The method of producing a color selection mask used for a high definition cathode ray tube of the present invention is not limited to the above embodiments. For example, the above embodiments may be applied to an aperture grille.

In addition, various modifications may be made within the range not outside of the gist of the present invention.

According to the method of producing a color selection mask used for a high definition cathode ray tube of the present invention, it is possible to raise the precision of the fine working to two-fold that of the case of forming the apertures of a mask by just the conventional etching method. The unevenness of etching is reduced along with the increased fineness of the pitch of the apertures, the uniformity of the mask is greatly improved, and an improvement in the yield may be expected. Further, it is possible to make the iron-alloy plate thinner to the secondary processing limit (about 30 $\mu$m) of the mask for enabling the forming properties or tension of the mask to be secured by the thickness of the iron-alloy plate.

By forming a metal of a different type from the iron-alloy plate on the iron-alloy plate as an electrodeposited metal layer using electrofineforming, it is possible to reduce the doming phenomenon due to the heat expansion, AG vibration due to the intrinsic vibration, drift of the electron beam due to geomagnetism, halation due to secondary electrons, and so forth.

What is claimed is:

1. A method of producing a color selection electrode used for a cathode ray tube including an electron gun and a phosphor screen, said color selection electrode being positioned between the electron gun and the phosphor screen and having apertures though which an electron beam generated from the electron gun selectively passes to the phosphor screen;

said method comprising the steps of:

depositing a first resist on both surfaces of a metal substrate, a first plane of the substrate facing the electron gun and a second plane of the substrate facing the phosphor screen, and patterning the same by photolithography;

electrodepositing a metal on portions of the first plane of the substrate where the first resist is not formed to form an electrodeposited metal layer;

depositing a second resist on the entire surface of the substrate which is directed to the first plane to cover the first resist and the electrodeposited metal layer;

using the first resist as a mask and etching the second plane of the substrate;

removing the first resist and the second resist; and;

wherein, in the step of forming the electrodeposited metal layer, a metal is simultaneously electrodeposited on the second plane of the substrate as well.

2. A method of producing a color selection electrode as set forth in claim 1, wherein, in the step of forming the electrodeposited metal layer, the second plane of the substrate is insulated by adhesion of a laminate film.

3. A method of producing a color selection electrode as set forth in claim 2, wherein the substrate and the electrodeposited metal layer are different types of metals.

4. A method of color selection electrode as set forth in claim 1, wherein the substrate and the electrodeposited metal layer are different types of metals.

* * * * *